(12) United States Patent
Chae et al.

(10) Patent No.: US 9,105,411 B2
(45) Date of Patent: Aug. 11, 2015

(54) MULTILAYER CERAMIC CAPACITOR AND METHOD OF MANUFACTURING THE SAME

(71) Applicant: SAMSUNG ELECTRO-MECHANICS CO., LTD., Suwon, Gyunggi-do (KR)

(72) Inventors: Eun Hyuk Chae, Gyunggi-do (KR); Byoung Hwa Lee, Gyunggi-do (KR)

(73) Assignee: SAMSUNG ELECTRO-MECHANICS CO., LTD., Suwon, Gyunggi-Do (KR)

( * ) Notice: Subject to any disclaimer, the term of this patent is extended or adjusted under 35 U.S.C. 154(b) by 104 days.

(21) Appl. No.: 14/067,848

(22) Filed: Oct. 30, 2013

(65) Prior Publication Data

US 2015/0022942 A1     Jan. 22, 2015

(30) Foreign Application Priority Data

Jul. 17, 2013    (KR) ........................ 10-2013-0084171

(51) Int. Cl.
| | |
|---|---|
| *H01G 4/12* | (2006.01) |
| *H01G 4/228* | (2006.01) |
| *H01G 4/30* | (2006.01) |
| *H01G 2/06* | (2006.01) |

(Continued)

(52) U.S. Cl.
CPC ................. *H01G 4/30* (2013.01); *H01G 2/065* (2013.01); *H01G 4/008* (2013.01); *H01G 4/33* (2013.01); *H05K 2201/10015* (2013.01)

(58) Field of Classification Search
CPC ......... H01G 4/008; H01G 2/065; H01G 4/33; H01G 4/30; H05K 2201/10015
See application file for complete search history.

(56) References Cited

U.S. PATENT DOCUMENTS 6,473,292 B1 * 10/2002 Yoshida et al. ............ 361/321.2
8,174,816 B2 * 5/2012 Seo et al. ................... 361/321.2

(Continued)

FOREIGN PATENT DOCUMENTS

| CN | 102810398 A | 12/2012 |
|---|---|---|
| JP | 06-215978 A | 8/1994 |

(Continued)

OTHER PUBLICATIONS

Taiwanese Examination Report issued in Taiwanese Patent Application No. 102137444 dated Sep. 9, 2014, with English Translation.

(Continued)

*Primary Examiner* — Jeremy C Norris
*Assistant Examiner* — Nathan Milakovich
(74) *Attorney, Agent, or Firm* — McDermott Will & Emery LLP

(57) ABSTRACT

A multilayer ceramic capacitor includes a ceramic body; an active layer including a plurality of first and second internal electrodes alternately exposed to both end surfaces of the ceramic body with a dielectric layer interposed therebetween; upper and lower cover layers formed on upper and lower surfaces of the active layer; and first and second external electrodes formed on the end surfaces of the ceramic body, wherein when a thickness of the ceramic body is defined as T, a thickness of the active layer is defined as S, a thickness of the lower cover layer is defined as C, and a distance from an end of a lowermost internal electrode in a length direction to an end of a band portion of an external electrode close to the end of the lowermost internal electrode is defined A, $0.25 \leq S/T \leq 0.75$ and $3 \leq A/C \leq 10$ are satisfied.

10 Claims, 2 Drawing Sheets

(51) Int. Cl.
  *H01G 4/008* (2006.01)
  *H01G 4/33* (2006.01)

(56) References Cited

U.S. PATENT DOCUMENTS

| | | | |
|---|---|---|---|
| 8,351,181 B1* | 1/2013 | Ahn et al. | 361/321.2 |
| 2001/0055192 A1 | 12/2001 | Nakano et al. | |
| 2006/0256504 A1 | 11/2006 | Kojima | |
| 2011/0293894 A1 | 12/2011 | Sato et al. | |
| 2012/0307417 A1 | 12/2012 | Kim et al. | |
| 2013/0229748 A1* | 9/2013 | Chung et al. | 361/301.4 |
| 2014/0166351 A1* | 6/2014 | Lee et al. | 174/258 |
| 2014/0185184 A1* | 7/2014 | Ahn et al. | 361/301.4 |
| 2014/0226255 A1* | 8/2014 | Chung et al. | 361/301.4 |
| 2014/0240897 A1* | 8/2014 | Chung et al. | 361/301.4 |
| 2014/0367152 A1* | 12/2014 | Lee et al. | 174/260 |
| 2014/0368968 A1* | 12/2014 | Lee et al. | 361/301.4 |
| 2015/0008024 A1* | 1/2015 | Park et al. | 174/260 |
| 2015/0043124 A1* | 2/2015 | Kim et al. | 361/301.4 |
| 2015/0060122 A1* | 3/2015 | Lee et al. | 174/260 |

FOREIGN PATENT DOCUMENTS

| | | | | |
|---|---|---|---|---|
| JP | 08130160 A | * | 5/1996 | H01G 4/30 |
| JP | 2003-022929 A | | 1/2003 | |
| JP | 2005-252104 A | | 9/2005 | |
| JP | 2011-253895 A | | 12/2011 | |
| KR | 2001-0089761 A | | 10/2001 | |
| TW | 1299172 | | 7/2008 | |

OTHER PUBLICATIONS

Japanese Office Action issued in Japanese Application No. 2013-220992 dated Dec. 2, 2014, with English translation.

* cited by examiner

MULTILAYER CERAMIC CAPACITOR AND METHOD OF MANUFACTURING THE SAME

CROSS-REFERENCE TO RELATED APPLICATION

This application claims the benefit of Korean Patent Application No. 10-2013-0084171 filed on Jul. 17, 2013, with the Korean Intellectual Property Office, the disclosure of which is incorporated herein by reference.

BACKGROUND OF THE INVENTION

1. Field of the Invention

The present invention relates to a multilayer ceramic capacitor and a method of manufacturing the same.

2. Description of the Related Art

A multilayer ceramic capacitor, a multilayer chip electronic component, is a chip-type condenser mounted on a printed circuit board (PCB) of various electronic products such as imaging devices (or video display devices) like liquid crystal displays (LCDs), plasma display panels (PDPs), and the like, computers, personal digital assistants (PDAs), cellular phones, and the like, to charge and discharge electricity.

A multilayer ceramic capacitor (MLCC), having advantages such as compactness, high capacitance, and ease of mountability, may be used as a component of various electronic devices.

Also, in the MLCC, internal electrodes are printed on individual ceramic sheets so as to be smaller than the ceramic sheets and have a predetermined thickness. When the ceramic sheets having the internal electrodes printed thereon are stacked, steps are inevitably generated between marginal portions in which no internal electrodes are formed and dielectric layers on which the internal electrodes are formed.

Such steps may be severe in the outermost portions of the internal electrodes.

Due to the steps, in a case in which a thermal shock is applied or stress resulting from warpage of a printed circuit board (PCB) having the MLCC mounted thereon is applied, portions of the dielectric layers may be delaminated or cracks may be generated.

Then, moisture, other foreign objects, or the like, may infiltrate into exposed portions of the internal electrodes due to the delamination or cracks, to thereby degrade insulation resistance, reliability, or the like.

Patent document 1 discloses an MLCC, but fails to disclose a limitation in numerical values regarding a ratio between a ceramic body and an active layer and a ratio between a thickness of a lower cover layer and a distance from an end of the lowermost internal electrode in a length direction to an end of a band portion of an external electrode close thereto.

RELATED ART DOCUMENT (Patent document 1) Korean Patent Laid-Open Publication No. 10-2001-0089761

SUMMARY OF THE INVENTION

An aspect of the present invention provides a novel scheme regarding a multilayer ceramic capacitor (MLCC), capable of restraining the occurrence of delamination or cracks due to a thermal shock or a mechanical shock such as stress resulting from warpage of a printed circuit board after the MLCC is mounted thereon, by compensating for steps between marginal portions in which internal electrodes are not formed and dielectric layers on which internal electrodes are formed.

According to an aspect of the present invention, there is provided a multilayer ceramic capacitor including: a ceramic body having a plurality of dielectric layers laminated therein; an active layer including a plurality of first and second internal electrodes alternately exposed to both end surfaces of the ceramic body with the dielectric layer interposed therebetween; upper and lower cover layers formed on upper and lower surfaces of the active layer; and first and second external electrodes formed on the end surfaces of the ceramic body, wherein when a thickness of the ceramic body is defined as T, a thickness of the active layer is defined as S, a thickness of the lower cover layer is defined as C, and a distance from an end of a lowermost internal electrode in a length direction to an end of a band portion of an external electrode close to the end of the lowermost internal electrode is defined A, $0.25 \leq S/T \leq 0.75$ and $3 \leq A/C \leq 10$ are satisfied.

The ceramic body may have a thickness of 80 μm or less.

A thickness of the lower cover layer may be greater than that of the upper cover layer.

The multilayer ceramic capacitor may further include first and second plating layers covering the first and second external electrodes formed on the end surfaces of the ceramic body.

The first and second plating layers may have a thickness of 5 μm or less.

According to another aspect of the present invention, there is provided a method of manufacturing a multilayer ceramic capacitor, the method including: preparing a plurality of ceramic green sheets; forming a plurality of first and second internal electrodes on the individual ceramic green sheets so as to be exposed in opposite directions; stacking the plurality of ceramic green sheets having the first and second internal electrodes formed thereonto form a preliminary laminate; stacking one or more ceramic green sheets upper and lower surfaces of the preliminary laminate to form upper and lower cover layers to form a ceramic laminate; sintering the ceramic laminate to form a ceramic body; and forming first and second external electrodes on both end surfaces of the ceramic body such that the first and second external electrodes are electrically connected to exposed portions of the first and second internal electrodes, wherein when a thickness of the ceramic body is defined as T, a thickness of the preliminary laminate is defined as S, a thickness of the lower cover layer is defined as C, and a distance from an end of a lowermost internal electrode in a length direction to an end of a band portion of an external electrode close to the end of the lowermost internal electrode is defined A, the upper and lower cover layers, the first and second internal electrodes, and the first and second external electrodes are formed to satisfy $0.25 \leq S/T \leq 0.75$ and $3 \leq A/C \leq 10$.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE EMBODIMENTS

Figure 1:
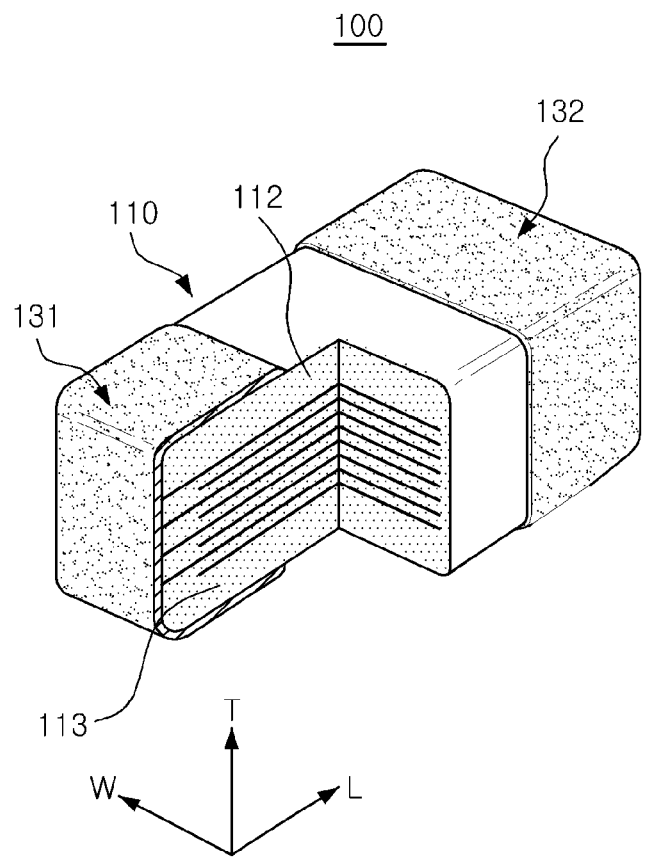
FIG. 1 is a partially cutaway perspective view of a multilayer ceramic capacitor (MLCC) according to an embodiment of the present invention.

Hereinafter, embodiments of the present invention will be described in detail with reference to the accompanying drawings.

The invention may, however, be embodied in many different forms and should not be construed as being limited to the embodiments set forth herein. Rather, these embodiments are provided so that this disclosure will be thorough and complete, and will fully convey the scope of the invention to those skilled in the art.

In the drawings, the shapes and dimensions of elements may be exaggerated for clarity, and the same reference numerals will be used throughout to designate the same or like elements.

In order to clarify embodiments of the present invention, directions of a ceramic body having a hexahedral shape may be defined as follows: L, W, and T in FIG. 1 denote a length direction, a width direction, and a thickness direction, respectively. Here, the thickness direction may also refer to a lamination direction in which dielectric layers are laminated.

Also, for convenience of explanations, surfaces of the ceramic body on which first and second external electrodes are formed in a length direction of the ceramic body are defined as end surfaces, and surfaces of the ceramic body perpendicular to the end surfaces are defined as left and right lateral surfaces.

Figure 2:
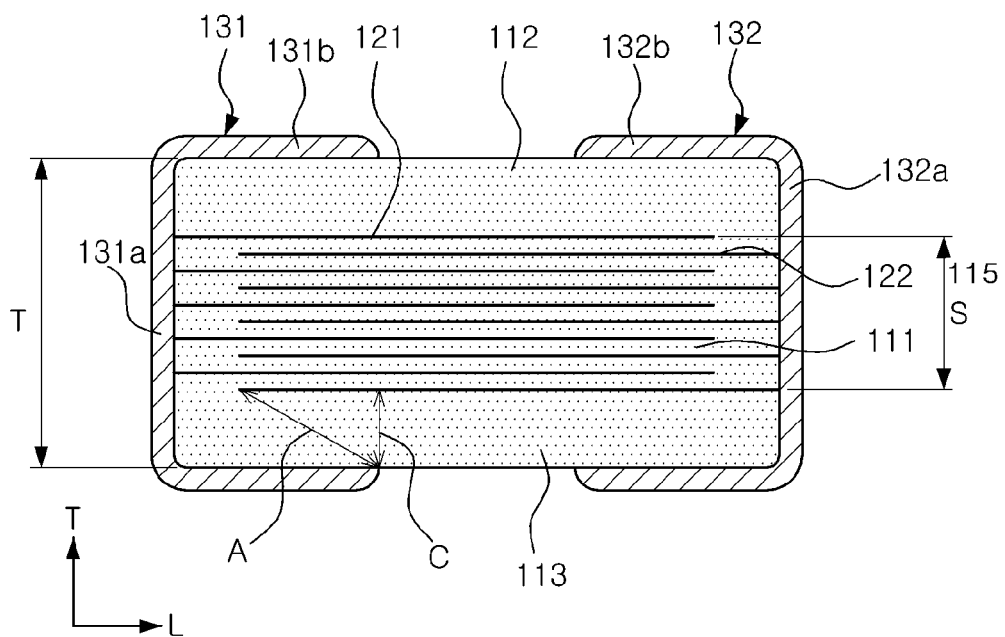
FIG. 2 is a cross-sectional view of the MLCC of FIG. 1 taken in a length direction of the MLCC.

Referring to FIGS. 1 and 2, a multilayer ceramic capacitor (MLCC) 100 according to an embodiment of the invention may include a ceramic body 110, an active layer 115 having first and second internal electrodes 121 and 122, upper and lower cover layers 112 and 113, and first and second external electrodes 131 and 132 covering the end surfaces of the ceramic body 110.

The ceramic body 110 may be formed by stacking a plurality of dielectric layers 111 and sintering the same. The shape and dimensions of the ceramic body 110 and the number of stacked dielectric layers 111 are not limited to those illustrated in the present embodiment.

Also, the plurality of dielectric layers 111 forming the ceramic body 110 are in a sintered state, and adjacent dielectric layers 111 may be integrated such that boundaries therebetween may not be readily apparent without the use of a scanning electron microscope (SEM).

The ceramic body 110 may include the active layer 115 as a portion of the capacitor contributing to the formation of capacitance, and the upper and lower cover layers 112 and 113, as margin portions, formed on upper and lower surfaces of the active layer 115.

The active layer 115 may be formed by iteratively stacking the first and second internal electrodes 121 and 122 with the dielectric layer 111 interposed therebetween.

Here, a thickness of the dielectric layer 111 may be arbitrarily changed according to design of capacitance of the MLCC 100. Preferably, a thickness of one dielectric layer 111 after sintering may range from 0.01 µm to 1.00 µm, but the invention is not limited thereto.

Also, the dielectric layer 111 may be made of ceramic powder having high permittivity, e.g., a barium titanate (BaTiO$_3$)-based powder, a strontium titanate (SrTiO$_3$)-based powder, or the like, but the invention is not limited thereto.

The upper and lower cover layers 112 and 113 may be made of the same material and have the same configuration as those of the dielectric layers 111, except that they do not include any internal electrode.

The upper and lower cover layers 112 and 113 may be formed by using a single dielectric layer or stacking two or more dielectric layers on the upper and lower surfaces of the active layer 115, and may basically serve to prevent damage to the first and second internal electrodes 121 and 122 due to physical or chemical stress.

The first and second internal electrodes 121 and 122, a pair of electrodes having opposite polarities, may be formed by printing a conductive paste including a conductive metal on ceramic green sheets to have a predetermined thickness, such that the first and second internal electrodes 121 and 122 are alternately exposed to both end surfaces of the ceramic body in the lamination direction of the dielectric layers 111. The first and second internal electrodes 121 and 122 may be electrically insulated from one another by the dielectric layer 111 disposed therebetween.

Namely, the first and second internal electrodes 121 and 122 may be electrically connected to the first and second external electrodes 131 and 132 through portions thereof alternately exposed to both end surfaces of the ceramic body 110.

Thus, when voltage is applied to the first and second external electrodes 131 and 132, charges are accumulated between the mutually facing first and second internal electrodes 121 and 122 and, here, capacitance of the MLCC 100 is proportional to an area of an overlap region of the first and second internal electrodes 121 and 122.

A thickness of the first and second internal electrodes may be determined according to intended use of MLCCs. For example, the thickness of the first and second internal electrodes may be determined to range from 0.2 µm to 1.0 µm in consideration of the size of the ceramic body 110, but the invention is not limited thereto.

Also, a conductive metal included in the conductive paste forming the first and second internal electrodes 121 and 122 may be nickel (Ni), copper (Cu), palladium (Pd), or an alloy thereof, but the invention is not limited thereto.

Also, the conductive paste may be printed by using a screen printing method, a gravure printing method, or the like, but the invention is not limited thereto.

The first and second external electrodes 131 and 132 may include the head portions 131a and 132a covering both end surfaces of the ceramic body 110 in the length direction with the conductive paste including a conductive metal, and the band portions 131b and 132b extending from the head portions 131a and 132a and covering portions of the upper and lower surfaces and the lateral surfaces of the ceramic body 110.

Here, the conductive metal may be nickel (Ni), copper (Cu), palladium (Pd), gold (Au), or an alloy thereof, but the invention is not limited thereto.

Meanwhile, first and second plating layers (not shown) may be further formed on both end surfaces of the ceramic body 110 to cover the first and second electrodes 131 and 132.

The first and second plating layers may serve to further increase an effect of preventing the occurrence of cracks in the ceramic body 110 due to shrinkage or tensile stress generated during a plating process.

The thickness of the first and second plating layers may be adjusted to be equal to or smaller than 5 µm to prevent degradation of reliability due to infiltration of moisture into the ceramic body 110, but the invention is not limited thereto.

It is required to increase reliability by reducing the occurrence of warpage cracks or delamination by adjusting a distance between the first and second external electrodes 131 and 132 and end portions of the first and second internal electrodes 121 and 122 in which steps are mainly generated when the MLCC 100 is mounted on a printed circuit board (PCB) and by adjusting a thickness of the ceramic body 110 and that of the active layer 115.

In the present embodiment, an overall thickness of the ceramic body 110 is defined as T, an overall thickness of the active layer 115 is defined as S, a thickness of the lower cover layer 113 is defined as C, and a distance from an end of the lowermost second internal electrode 122 in the length direction to an end of the band portion 131b of the first external electrode 131 close to the end of the lowermost second internal electrode 122 is defined as A.

Here, the overall thickness of the ceramic body 110 refers to a distance from the upper surface of the ceramic body 110 to the lower surface thereof, and the overall thickness of the active layer 115 refers to a distance from an upper surface of the first internal electrode 121 formed on the uppermost portion of the active layer 115 to a lower surface of the second internal electrode 122 formed on the lowermost portion of the active layer 115. The thickness C of the lower cover layer 113 refers to a distance from the lower surface of the second internal electrode 122 formed on the lowermost portion of the active layer 115 in the thickness direction to the lower surface of the ceramic body 110.

Here, ranges by which reliability can be enhanced by reducing the occurrence of delamination or warpage cracks may be $0.25 \leq S/T \leq 0.75$ and $3 \leq A/C \leq 10$.

Namely, a distance from the end portion of the internal electrode on which stress is concentrated due to a difference in shrinkage to the end portion of the external electrode on which plating stress is concentrated due to plating may be adjusted to be greater than a predetermined value, whereby warpage cracks may be prevented.

Here, in the case in which S/T is less than 0.25, warpage cracks may be generated, and in the case in which S/T exceeds 0.75, delamination may be generated.

Also, in the case in which A/C is less than 3, a portion of the ceramic body 110 on which mechanical impact such as stress resulting from warpage of a PCB due to a difference in shrinkage is concentrated may correspond to or be close to a portion thereof in which a step is generated, whereby a warpage crack occurrence rate may be increased.

Also, in the case in which A/C exceeds 10, breakdown voltage (BDV) may be reduced.

Figure 3:
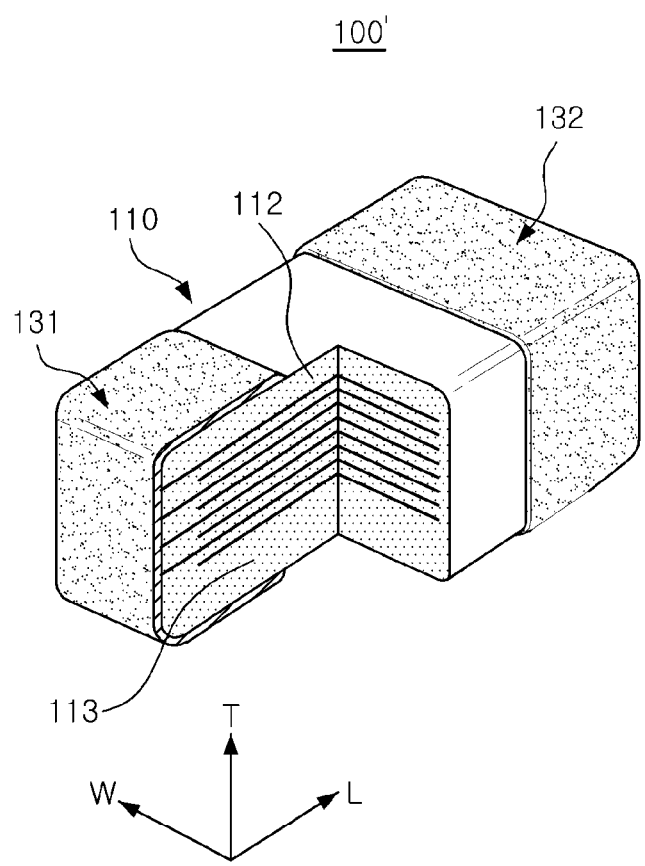
FIG. 3 is a partially cutaway perspective view of a multilayer ceramic capacitor (MLCC) according to another embodiment of the present invention.
Figure 4:
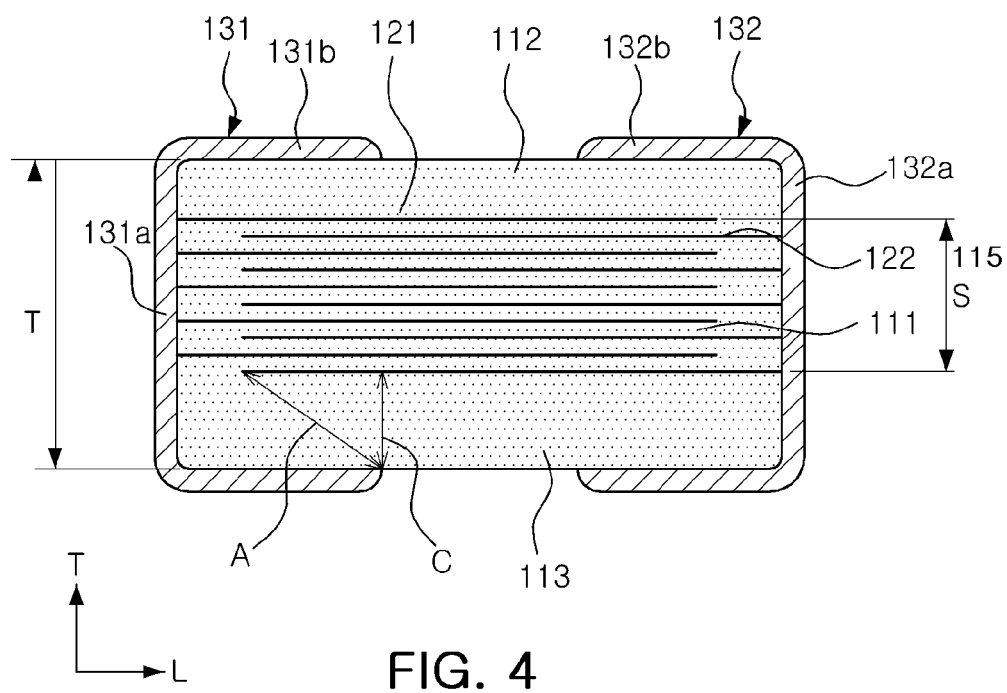
FIG. 4 is a cross-sectional view of the MLCC of FIG. 2 taken in a length direction of the MLCC.

FIGS. 3 and 4 illustrate an MLCC 100' according to another embodiment of the invention.

Referring to FIGS. 3 and 4, in the MLCC 100' according to another embodiment of the invention, the lower cover layer 113 may have a thickness greater than that of the upper cover layer 112 by increasing the number of dielectric layers stacked in the lower cover layer 113.

With this structure, the effect of preventing warpage cracks and delamination and the effect of reducing acoustic noise can be further obtained. Other features are the same as those described in the former embodiment, so a detailed description thereof will be omitted.

Hereinafter, relationships between dimensions of the components included in the MLCC, and the occurrence frequency of warpage cracks, delamination, and BDV reduction will be described.

MLCCs according to inventive and comparative examples may be manufactured as follows.

First, slurry including powder such as barium titanate (BaTiO$_3$), or the like, may be applied to carrier films and then dried to prepare a plurality of ceramic green sheets having a predetermined thickness.

Next, a conductive paste for internal electrodes may be applied to the individual ceramic green sheets so as to be exposed to one ends of the ceramic green sheets opposing one another in a length direction thereof, thereby forming the plurality of first and second internal electrodes 121 and 122.

Here, the conductive paste may be applied through a screen printing method, but the invention is not limited thereto.

Thereafter, the plurality of ceramic green sheets having the first and second internal electrodes 121 and 122 formed thereon may be stacked in a thickness direction to thereby form a preliminary laminate.

Ceramic green sheets having no internal electrode may be stacked on upper and lower surfaces of the preliminary laminate to thereby form a ceramic laminate.

Here, one or more ceramic green sheets having no internal electrode may be stacked on the upper and lower surfaces of the preliminary laminate, and the number of stacked ceramic green sheets having no internal electrode is not particularly limited.

Also, if necessary, the number of ceramic green sheets having no internal electrode stacked below the preliminary laminate may be greater than the number of ceramic green sheets having no internal electrode stacked above the preliminary laminate.

Thereafter, the ceramic laminate may be isostatic-pressed under a pressure condition of 1000 kgf/cm$^2$ at 85.

Here, when a thickness of the isostatic-pressed ceramic laminate is defined as T and a thickness of the active layer 115 including the plurality of first and second internal electrodes 121 and 122 is defined as S, the ceramic green sheets having the first and second internal electrodes 121 and 122 formed thereon and the ceramic green sheets having no internal electrode may be stacked to satisfy a range of $0.25 \leq S/T \leq 0.75$.

Thereafter, the isostatic-pressed ceramic laminate may be severed into individual chips, and a debinding process may be performed on the chips at 230 for 60 hours under air atmosphere.

Thereafter, the chips may be sintered at an oxygen partial pressure of $10^{-11}$ atm ~$10^{-10}$ atm, lower than a Ni/NiO equilibrium oxygen partial pressure, under a reducing atmosphere at a temperature of about 1200° C. in order for the first and second internal electrodes 121 and 122 not to be oxidized, thereby forming the ceramic bodies 110.

Here, the ceramic bodies 110 may be manufactured to have respective thicknesses of 150 mm, 100 mm, 80 mm, and 50 mm, after the sintering process, and in this case, manufacturing tolerance may be determined to be ±0.1 mm.

Thereafter, the first and second external electrodes 131 and 132 may be formed on both end surfaces of each ceramic body 110.

The first and second external electrodes 131 and 132 may include the head portions 131a and 132a covering both end surfaces of the ceramic body 110 so as to be electrically connected to the first and second internal electrodes 121 and 122, and the band portions 131b and 132b covering portions of the upper and lower surfaces and the lateral surfaces of the ceramic body 110.

Here, when a thickness of the lower cover layer 113 is defined as C and a distance from an end of the lowermost second internal electrode 122 in the length direction thereof to an end of the band portion 131b of the first external electrode 131 is defined A, the lower cover layer 113, the second internal electrode 122, and the band portion 131b of the first external electrode 131 may be formed to satisfy a range of $3 \leq A/C \leq 10$.

A length of a marginal portion of the first internal electrode 121 in the length direction and a length of the band portion 132b of the second external electrode 132 may be set to be similar to a length of a marginal portion of the second internal electrode 122 in the length direction and a length of the band portion 131b of the first external electrode 131, and the invention is not limited thereto.

Thereafter, if necessary, a plating process may be performed to form first and second plating layers covering the first and second external electrodes 131 and 132 formed on the end surfaces of the ceramic body 110.

Here, the first and second plating layers may be formed to have a thickness of 5 μm or less, and the invention is not limited thereto.

After the manufacturing of the MLCCs, they were tested to measure the occurrence frequency of warpage cracks, delamination, and BDV reduction.

Respective dimensions of the elements of each MLCC were measured based on an image of a cross-section of the ceramic body of the MLCC taken in the L-T direction, after being cut in a W-directional central portion of the ceramic body, by using a scanning electron microscope (SEM), as shown in FIG. 2.

Here, as described above, the overall thickness of the ceramic body 110 was defined as T, the overall thickness of the active layer 115 was defined as S, the thickness of the lower cover layer 113 was defined as C, and a distance from an end of the lowermost second internal electrode 122 in the L direction to an end of the band portion 131b of the first external electrode 131 in the L direction was defined A.

The occurrence frequencies of warpage cracks, delamination, and BDV reduction according to S/T and A/C of the MLCCs are shown in Table 1 in a case in which the thickness of the ceramic body 110 was 50 mm, are shown in Table 2 in a case in which the thickness of the ceramic body 110 was 80 mm, are shown in Table 3 in a case in which the thickness of the ceramic body 110 was 100 mm, and are shown in Table 4 in a case in which the thickness of the ceramic body 110 was 150 mm.

As for numerical values of warpage cracks, delamination, and BDV reduction, 200 samples in respective cases as described above were tested and numbers of defective samples were measured.

TABLE 1

| No. | Thickness of Ceramic Body (mm) | S/T | A/C | Occurrence Frequency of Warpage Cracks | Delamination | BDV Reduction |
|---|---|---|---|---|---|---|
| 1 | 50 | 0.15 | 2 | 0/200 | 0/200 | 0/200 |
| 2 | | | 3 | 0/200 | 0/200 | 0/200 |
| 3 | | | 5 | 0/200 | 0/200 | 0/200 |
| 4 | | | 7 | 0/200 | 0/200 | 0/200 |
| 5 | | | 10 | 0/200 | 0/200 | 13/200 |
| 6 | | | 12 | 0/200 | 0/200 | 27/200 |
| 7 | | 0.20 | 2 | 0/200 | 0/200 | 0/200 |
| 8 | | | 3 | 0/200 | 0/200 | 0/200 |
| 9 | | | 5 | 0/200 | 0/200 | 0/200 |
| 10 | | | 7 | 0/200 | 0/200 | 0/200 |
| 11 | | | 10 | 0/200 | 0/200 | 8/200 |
| 12 | | | 12 | 0/200 | 0/200 | 21/200 |
| 13 | | 0.25 | 2 | 6/200 | 0/200 | 0/200 |
| 14 | | | 3 | 0/200 | 0/200 | 0/200 |
| 15 | | | 5 | 0/200 | 0/200 | 0/200 |
| 16 | | | 7 | 0/200 | 0/200 | 0/200 |
| 17 | | | 10 | 0/200 | 0/200 | 0/200 |
| 18 | | | 12 | 0/200 | 0/200 | 12/200 |
| 19 | | 0.30 | 2 | 12/200 | 0/200 | 0/200 |
| 20 | | | 3 | 0/200 | 0/200 | 0/200 |
| 21 | | | 5 | 0/200 | 0/200 | 0/200 |
| 22 | | | 7 | 0/200 | 0/200 | 0/200 |
| 23 | | | 10 | 0/200 | 0/200 | 0/200 |
| 24 | | | 12 | 0/200 | 0/200 | 7/200 |
| 25 | | 0.50 | 2 | 17/200 | 0/200 | 0/200 |
| 26 | | | 3 | 0/200 | 0/200 | 0/200 |
| 27 | | | 5 | 0/200 | 0/200 | 0/200 |
| 28 | | | 7 | 0/200 | 0/200 | 0/200 |
| 29 | | | 10 | 0/200 | 0/200 | 0/200 |
| 30 | | | 12 | 0/200 | 0/200 | 5/200 |
| 31 | | 0.75 | 2 | 23/200 | 0/200 | 0/200 |
| 32 | | | 3 | 0/200 | 0/200 | 0/200 |
| 33 | | | 5 | 0/200 | 0/200 | 0/200 |
| 34 | | | 7 | 0/200 | 0/200 | 0/200 |
| 35 | | | 10 | 0/200 | 0/200 | 0/200 |
| 36 | | | 12 | 0/200 | 0/200 | 3/200 |
| 37 | | 0.85 | 2 | 27/200 | 4/200 | 0/200 |
| 38 | | | 3 | 18/200 | 10/200 | 0/200 |
| 39 | | | 5 | 15/200 | 31/200 | 0/200 |
| 40 | | | 7 | 7/200 | 54/200 | 0/200 |
| 41 | | | 10 | 1/200 | 64/200 | 0/200 |
| 42 | | | 12 | 0/200 | 89/200 | 3/200 |

<MLCCs each having a ceramic body having a thickness of 50 mm>

TABLE 2

| No. | Thickness of Ceramic Body (mm) | S/T | A/C | Occurrence Frequency of Warpage Cracks | Delamination | BDV Reduction |
|---|---|---|---|---|---|---|
| 1 | 80 | 0.15 | 2 | 0/200 | 0/200 | 0/200 |
| 2 | | | 3 | 0/200 | 0/200 | 0/200 |
| 3 | | | 5 | 0/200 | 0/200 | 0/200 |
| 4 | | | 7 | 0/200 | 0/200 | 2/200 |
| 5 | | | 10 | 0/200 | 0/200 | 16/200 |
| 6 | | | 12 | 0/200 | 0/200 | 31/200 |
| 7 | | 0.20 | 2 | 0/200 | 0/200 | 0/200 |
| 8 | | | 3 | 0/200 | 0/200 | 0/200 |
| 9 | | | 5 | 0/200 | 0/200 | 0/200 |
| 10 | | | 7 | 0/200 | 0/200 | 0/200 |
| 11 | | | 10 | 0/200 | 0/200 | 10/200 |
| 12 | | | 12 | 0/200 | 0/200 | 27/200 |
| 13 | | 0.25 | 2 | 4/200 | 0/200 | 0/200 |
| 14 | | | 3 | 0/200 | 0/200 | 0/200 |
| 15 | | | 5 | 0/200 | 0/200 | 0/200 |
| 16 | | | 7 | 0/200 | 0/200 | 0/200 |
| 17 | | | 10 | 0/200 | 0/200 | 0/200 |
| 18 | | | 12 | 0/200 | 0/200 | 13/200 |
| 19 | | 0.30 | 2 | 9/200 | 0/200 | 0/200 |
| 20 | | | 3 | 0/200 | 0/200 | 0/200 |
| 21 | | | 5 | 0/200 | 0/200 | 0/200 |
| 22 | | | 7 | 0/200 | 0/200 | 0/200 |
| 23 | | | 10 | 0/200 | 0/200 | 0/200 |
| 24 | | | 12 | 0/200 | 0/200 | 11/200 |
| 25 | | 0.50 | 2 | 15/200 | 0/200 | 0/200 |
| 26 | | | 3 | 0/200 | 0/200 | 0/200 |
| 27 | | | 5 | 0/200 | 0/200 | 0/200 |
| 28 | | | 7 | 0/200 | 0/200 | 0/200 |
| 29 | | | 10 | 0/200 | 0/200 | 0/200 |
| 30 | | | 12 | 0/200 | 0/200 | 10/200 |
| 31 | | 0.75 | 2 | 21/200 | 0/200 | 0/200 |
| 32 | | | 3 | 0/200 | 0/200 | 0/200 |
| 33 | | | 5 | 0/200 | 0/200 | 0/200 |
| 34 | | | 7 | 0/200 | 0/200 | 0/200 |
| 35 | | | 10 | 0/200 | 0/200 | 0/200 |
| 36 | | | 12 | 0/200 | 0/200 | 9/200 |
| 37 | | 0.85 | 2 | 24/200 | 2/200 | 0/200 |
| 38 | | | 3 | 19/200 | 5/200 | 0/200 |
| 39 | | | 5 | 14/200 | 21/200 | 0/200 |
| 40 | | | 7 | 4/200 | 34/200 | 0/200 |

TABLE 2-continued

| No. | Thickness of Ceramic Body (mm) | S/T | A/C | Occurrence Frequency of Warpage Cracks | Delamination | BDV Reduction |
|---|---|---|---|---|---|---|
| 41 | | | 10 | 0/200 | 58/200 | 0/200 |
| 42 | | | 12 | 0/200 | 84/200 | 6/200 |

<MLCCs each having a ceramic body having a thickness of 80 mm>

TABLE 3

| No. | Thickness of Ceramic Body (mm) | S/T | A/C | Occurrence Frequency of Warpage Cracks | Delamination | BDV Reduction |
|---|---|---|---|---|---|---|
| 1 | 100 | 0.15 | 2 | 0/200 | 0/200 | 0/200 |
| 2 | | | 3 | 0/200 | 0/200 | 0/200 |
| 3 | | | 5 | 0/200 | 0/200 | 0/200 |
| 4 | | | 7 | 0/200 | 0/200 | 8/200 |
| 5 | | | 10 | 0/200 | 0/200 | 27/200 |
| 6 | | | 12 | 0/200 | 0/200 | 46/200 |
| 7 | | 0.20 | 2 | 0/200 | 0/200 | 0/200 |
| 8 | | | 3 | 0/200 | 0/200 | 0/200 |
| 9 | | | 5 | 0/200 | 0/200 | 0/200 |
| 10 | | | 7 | 0/200 | 0/200 | 3/200 |
| 11 | | | 10 | 0/200 | 0/200 | 15/200 |
| 12 | | | 12 | 0/200 | 0/200 | 31/200 |
| 13 | | 0.25 | 2 | 0/200 | 0/200 | 0/200 |
| 14 | | | 3 | 0/200 | 0/200 | 0/200 |
| 15 | | | 5 | 0/200 | 0/200 | 0/200 |
| 16 | | | 7 | 0/200 | 0/200 | 0/200 |
| 17 | | | 10 | 0/200 | 0/200 | 9/200 |
| 18 | | | 12 | 0/200 | 0/200 | 19/200 |
| 19 | | 0.30 | 2 | 0/200 | 0/200 | 0/200 |
| 20 | | | 3 | 0/200 | 0/200 | 0/200 |
| 21 | | | 5 | 0/200 | 0/200 | 0/200 |
| 22 | | | 7 | 0/200 | 0/200 | 0/200 |
| 23 | | | 10 | 0/200 | 0/200 | 1/200 |
| 24 | | | 12 | 0/200 | 0/200 | 11/200 |
| 25 | | 0.50 | 2 | 0/200 | 0/200 | 0/200 |
| 26 | | | 3 | 0/200 | 0/200 | 0/200 |
| 27 | | | 5 | 0/200 | 0/200 | 0/200 |
| 28 | | | 7 | 0/200 | 0/200 | 0/200 |
| 29 | | | 10 | 0/200 | 0/200 | 0/200 |
| 30 | | | 12 | 0/200 | 0/200 | 9/200 |
| 31 | | 0.75 | 2 | 0/200 | 0/200 | 0/200 |
| 32 | | | 3 | 0/200 | 0/200 | 0/200 |
| 33 | | | 5 | 0/200 | 0/200 | 0/200 |
| 34 | | | 7 | 0/200 | 0/200 | 0/200 |
| 35 | | | 10 | 0/200 | 0/200 | 0/200 |
| 36 | | | 12 | 0/200 | 0/200 | 9/200 |
| 37 | | 0.85 | 2 | 0/200 | 0/200 | 0/200 |
| 38 | | | 3 | 0/200 | 0/200 | 0/200 |
| 39 | | | 5 | 0/200 | 0/200 | 0/200 |
| 40 | | | 7 | 0/200 | 0/200 | 0/200 |
| 41 | | | 10 | 0/200 | 0/200 | 0/200 |
| 42 | | | 12 | 0/200 | 0/200 | 5/200 |

<MLCCs each having a ceramic body having a thickness of 100 mm>

TABLE 4

| No. | Thickness of Ceramic Body (mm) | S/T | A/C | Occurrence Frequency of Warpage Cracks | Delamination | BDV Reduction |
|---|---|---|---|---|---|---|
| 1 | 150 | 0.15 | 2 | 0/200 | 0/200 | 0/200 |
| 2 | | | 3 | 0/200 | 0/200 | 0/200 |
| 3 | | | 5 | 0/200 | 0/200 | 0/200 |
| 4 | | | 7 | 0/200 | 0/200 | 18/200 |
| 5 | | | 10 | 0/200 | 0/200 | 35/200 |
| 6 | | | 12 | 0/200 | 0/200 | 64/200 |
| 7 | | 0.20 | 2 | 0/200 | 0/200 | 0/200 |
| 8 | | | 3 | 0/200 | 0/200 | 0/200 |
| 9 | | | 5 | 0/200 | 0/200 | 0/200 |
| 10 | | | 7 | 0/200 | 0/200 | 16/200 |
| 11 | | | 10 | 0/200 | 0/200 | 31/200 |
| 12 | | | 12 | 0/200 | 0/200 | 57/200 |
| 13 | | 0.25 | 2 | 0/200 | 0/200 | 0/200 |
| 14 | | | 3 | 0/200 | 0/200 | 0/200 |
| 15 | | | 5 | 0/200 | 0/200 | 0/200 |
| 16 | | | 7 | 0/200 | 0/200 | 9/200 |
| 17 | | | 10 | 0/200 | 0/200 | 22/200 |
| 18 | | | 12 | 0/200 | 0/200 | 45/200 |
| 19 | | 0.30 | 2 | 0/200 | 0/200 | 0/200 |
| 20 | | | 3 | 0/200 | 0/200 | 0/200 |
| 21 | | | 5 | 0/200 | 0/200 | 0/200 |
| 22 | | | 7 | 0/200 | 0/200 | 6/200 |
| 23 | | | 10 | 0/200 | 0/200 | 17/200 |
| 24 | | | 12 | 0/200 | 0/200 | 32/200 |
| 25 | | 0.50 | 2 | 0/200 | 0/200 | 0/200 |
| 26 | | | 3 | 0/200 | 0/200 | 0/200 |
| 27 | | | 5 | 0/200 | 0/200 | 0/200 |
| 28 | | | 7 | 0/200 | 0/200 | 2/200 |
| 29 | | | 10 | 0/200 | 0/200 | 11/200 |
| 30 | | | 12 | 0/200 | 0/200 | 25/200 |
| 31 | | 0.75 | 2 | 0/200 | 0/200 | 0/200 |
| 32 | | | 3 | 0/200 | 0/200 | 0/200 |
| 33 | | | 5 | 0/200 | 0/200 | 0/200 |
| 34 | | | 7 | 0/200 | 0/200 | 0/200 |
| 35 | | | 10 | 0/200 | 0/200 | 7/200 |
| 36 | | | 12 | 0/200 | 0/200 | 18/200 |
| 37 | | 0.85 | 2 | 0/200 | 0/200 | 0/200 |
| 38 | | | 3 | 0/200 | 0/200 | 0/200 |
| 39 | | | 5 | 0/200 | 0/200 | 0/200 |
| 40 | | | 7 | 0/200 | 0/200 | 0/200 |
| 41 | | | 10 | 0/200 | 0/200 | 0/200 |
| 42 | | | 12 | 0/200 | 0/200 | 8/200 |

<MLCCs each having a ceramic body having a thickness of 150 mm>

In Table 1, it can be seen that, in the case of samples 13 to 36 in which S/T ranged from 0.25 to 0.75, when A/C ranged from 3 to 10, warpage cracks and delamination did not occur and BDV was not reduced.

However, it can be seen that, even when S/T ranged from 0.25 to 0.75, in the case of samples 13, 19, 25, and 31 in which A/C was less than 3, warpage cracks occurred, and in the case of samples 18, 24, 30, and 36 in which A/C exceeded 10, BDV was reduced.

Also, it can be seen that, in the case of samples 5 and 11 among the samples in which S/T was less than 0.25, even when A/C was equal to or less than 10, BDV was reduced.

Also, it can be seen that, in the case of samples 38 to 41 in which S/T exceeded 0.75, even when A/C satisfied the range of 3 to 10, warpage cracks occurred and delamination occurred severely.

In Table 2, it can be seen that, in the case of samples 13 to 36 in which S/T ranged from 0.25 to 0.75, when A/C ranged from 3 to 10, warpage cracks and delamination did not occur and BDV was not reduced.

However, it can be seen that, even when S/T ranged from 0.25 to 0.75, in the case of samples 13, 19, 25, and 31 in which A/C was less than 3, warpage cracks occurred, and in the case of samples 18, 24, 30, and 36 in which A/C exceeded 10, BDV was reduced.

Also, it can be seen that, in the case of samples 4, 5, and 11, among the samples in which S/T was less than 0.25, even when A/C was not greater than 10, BDV was reduced.

Also, it can be seen that, in the case of samples 38 to 41 in which S/T exceeded 0.75, even when A/C satisfied the range of 3 to 10, warpage cracks occurred and delamination occurred severely.

Thus, it can be seen that a desirable numerical value range in which the occurrence of warpage cracks and delamination is restrained and a reduction of BDV is prevented is $0.25 \leq S/T \leq 0.75$ and $3 \leq A/C \leq 10$.

Referring to Table 3, in the case of samples 17 and 23 among the samples in which S/T ranged from 0.25 to 0.75 and A/C ranged from 3 to 10, warpage cracks and delamination did not occur, but BDV was reduced.

Referring to Table 4, in the case of samples 16, 17, 22, 23, 28, 29 and 35 among the samples in which S/T ranged from 0.25 to 0.75 and A/C ranged from 3 to 10, warpage cracks and delamination did not occur, but BDV was reduced.

Thus, it can be seen that a thickness of the ceramic body 110 sufficient to restrain the occurrence of warpage cracks and delamination and prevent a reduction of BDV is equal to or less than 80 μm.

As set forth above, according to embodiments of the invention, the occurrence of delamination or cracks, due to thermal shock or mechanical shock such as stress generated due to the warpage of a printed circuit board after the MLCC is mounted thereon, may be restrained by compensating for steps in the ceramic body, such that infiltration of moisture or foreign objects into exposed surfaces of the internal electrodes may be avoided, whereby a degradation of insulation resistance may be prevented and reliability of the MLCC may be improved.

While the present invention has been shown and described in connection with the embodiments, it will be apparent to those skilled in the art that modifications and variations can be made without departing from the spirit and scope of the invention as defined by the appended claims.

What is claimed is:

1. A multilayer ceramic capacitor comprising:
    a ceramic body having a plurality of dielectric layers laminated therein;
    an active layer including a plurality of first and second internal electrodes alternately exposed to both end surfaces of the ceramic body with the dielectric layer interposed therebetween;
    upper and lower cover layers formed on upper and lower surfaces of the active layer; and
    first and second external electrodes formed on the end surfaces of the ceramic body,
    wherein when a thickness of the ceramic body is defined as T, a thickness of the active layer is defined as S, a thickness of the lower cover layer is defined as C, and a distance from an end of a lowermost internal electrode in a length direction to an end of a band portion of an external electrode close to the end of the lowermost internal electrode is defined A, $0.25 \leq S/T \leq 0.75$ and $3 \leq A/C \leq 10$ are satisfied.

2. The multilayer ceramic capacitor of claim 1, wherein the ceramic body has a thickness of 80 μm or less.

3. The multilayer ceramic capacitor of claim 1, wherein a thickness of the lower cover layer is greater than that of the upper cover layer.

4. The multilayer ceramic capacitor of claim 1, further comprising first and second plating layers covering the first and second external electrodes formed on the end surfaces of the ceramic body.

5. The multilayer ceramic capacitor of claim 4, wherein the first and second plating layers have a thickness of 5 μm or less.

6. A method of manufacturing a multilayer ceramic capacitor, the method comprising:
    preparing a plurality of ceramic green sheets;
    forming a plurality of first and second internal electrodes on the individual ceramic green sheets so as to be exposed in opposite directions;
    stacking the plurality of ceramic green sheets having the first and second internal electrodes formed thereonto form a preliminary laminate;
    stacking one or more ceramic green sheets on upper and lower surfaces of the preliminary laminate to form upper and lower cover layers to form a ceramic laminate;
    sintering the ceramic laminate to form a ceramic body; and
    forming first and second external electrodes on both end surfaces of the ceramic body such that the first and second external electrodes are electrically connected to exposed portions of the first and second internal electrodes,
    wherein when a thickness of the ceramic body is defined as T, a thickness of the preliminary laminate is defined as S, a thickness of the lower cover layer is defined as C, and a distance from an end of a lowermost internal electrode in a length direction to an end of a band portion of an external electrode close to the end of the lowermost internal electrode is defined A, the upper and lower cover layers, the first and second internal electrodes, and the first and second external electrodes are formed to satisfy $0.25 \leq S/T \leq 0.75$ and $3 \leq A/C \leq 10$.

7. The method of claim 6, wherein the ceramic green sheets are stacked to form the ceramic body having a thickness of 80 μm or less.

8. The method of claim 6, wherein in the forming of the upper and lower cover layers, a thickness of the lower cover layer is greater than that of the upper cover layer.

9. The method of claim 6, further comprising forming first and second plating layers to cover the first and second external electrodes formed on the end surfaces of the ceramic body, after the forming of the first and second external electrodes.

10. The method of claim 9, wherein the first and second plating layers are formed to have a thickness of 5 μm or less.

* * * * *